United States Patent [19]

Buchanan et al.

[11] Patent Number: 4,542,509

[45] Date of Patent: Sep. 17, 1985

[54] FAULT TESTING A CLOCK DISTRIBUTION NETWORK

[75] Inventors: Gregory S. Buchanan, Danbury, Conn.; John J. DeFazio, Poughkeepsie, N.Y.

[73] Assignee: International Business Machines Corporation, Armonk, N.Y.

[21] Appl. No.: 547,179

[22] Filed: Oct. 31, 1983

[51] Int. Cl.⁴ .............................................. G01R 31/28
[52] U.S. Cl. .......................................... 371/61; 371/15
[58] Field of Search ............................. 371/15, 61, 25; 324/73 R; 307/269; 364/200, 900

[56] References Cited

U.S. PATENT DOCUMENTS

| | | | |
|---|---|---|---|
| 3,056,108 | 9/1962 | Heineck | 340/146.1 |
| 3,783,254 | 1/1974 | Eichelberger | 235/152 |
| 4,063,078 | 12/1977 | DasGupta et al. | 364/700 |
| 4,081,662 | 3/1978 | Pehrson et al. | 235/308 |
| 4,144,448 | 3/1979 | Pisciotta et al. | 235/301 |
| 4,392,226 | 7/1983 | Cook | 371/61 |

OTHER PUBLICATIONS

Dimitri, Delay Testing and Diagnosis of LSSD Shift Register Strings, IBM Technical Disclosure Bulletin, vol. 20, No. 1, Jun. 1977, pp. 307-312.
Herceg et al., Complete Fault Detection and Fault Location for System Oscillator, IBM Technical Disclosure Bulletin, vol. 22, No. 1, Jun. 1979, pp. 80-82.
Kam, Clock Running Detector, IBM Technical Disclosure Bulletin, vol. 22, No. 11, Apr. 1980, pp. 4866-4868.

Primary Examiner—Charles E. Atkinson
Attorney, Agent, or Firm—Mitchell S. Bigel; Wesley DeBruin

[57] ABSTRACT

A method and apparatus for fault testing a clock distribution network which provides a plurality of clock signal lines to the logic networks which comprise a data processor. The fault testing apparatus includes a decoder for selecting one of the clock signal lines to be tested, and a test latch which is clocked by the selected clock signal line. The selected clock signal line is tested by setting the test latch to a first logic value (e.g., binary ZERO) and maintaining a second logic value (e.g., binary ONE) at the test latch input. If the second logic value is stored in the test latch when the clock distribution network is inhibited, then a stuck-on fault is indicated for the selected clock signal line. If the second logic value fails to be stored in the test latch when the clock distribution network is enabled, then a stuck-off fault is indicated for the selected clock signal line. Each clock signal line in the clock distribution network may be tested in this manner.

15 Claims, 7 Drawing Figures

FAULT TESTING A CLOCK DISTRIBUTION NETWORK

DESCRIPTION

BACKGROUND OF INVENTION

1. Technical Field

This invention relates to testing a data processor, and more particularly to a method and apparatus for fault testing a clock distribution network in a data processor.

As is well known to those having skill in the art, a data processor includes numerous complex logic networks for carrying on data processing operations. Interconnecting all the logic networks is a clock distribution network. The clock distribution network is a fan-out network for a clock signal generated by a high frequency oscillator. The clock signal is distributed to all the logic networks in a predetermined timing relationship. In a large data processor, on the order of 15,000 distinct clock signal lines may be provided. Accordingly, the clock distribution network may comprise 5-7% of the integrated circuit chips in the data processor.

2. Background Art

The complexity of the logic and clock distribution networks in a large data processor presents extreme difficulties in the testing environment. Typically, tests are performed on the data processor prior to shipment. Internal tests are also generally performed by the data processor each time it is turned on to assure fault-free performance.

Many techniques ae known for fault testing the logic network portion of a data processor. For example, one widely known technique for testing a logic network is the Level Sensitive Scan Design (LSSD) technique wherein normally inaccessible logic points on an integrated circuit chip are accessed by means of a shift register latch network. The LSSD technique is described in detail in many publications and patents, for example, U.S. Pat. No. 3,783,254 entitled "Level Sensitive Logic System", E. B. Eichelberger and assigned to the assignee of the present invention. The LSSD technique allows the complex logic networks which form a data processor to be fully tested.

Techniques have heretofore not existed for fault testing the clock distribution network of a data processor. Generally each clock signal line in the clock distribution network is susceptible to two types of faults, referred to as "stuck-on" or "stuck-off" faults. A "stuck-on" fault, also referred to as a "hot clock", means that the clock signal line is still supplying a clock signal even though the clock distribution network is disabled. For example, a clock signal line which is short circuited to a power supply line would provide a "hot clock". A "stuck-off" fault, also referred to as a "cold clock", means that the clock signal line does not supply a clock signal even though the clock distribution network is enabled. For example, an open circuited clock signal line would provide a "cold clock".

Heretofore, when the clock distribution network failed (i.e., one or more clock signal lines become stuck-on or stuck-off), the defect would manifest itself as a defect in the logic network being supplied by the clock distribution network. While it would be known that the data processor as a whole had a defect, it could not be ascertained whether the defect arose in the logic network itself or in the clock distribution network. Moreover, even if it could be ascertained that the defect arose in the clock distribution network, it was heretofore impossible to isolate the defect to a particular clock signal line on a particular integrated circuit chip within the clock distribution network.

DISCLOSURE OF INVENTION

It is therefore a primary object of the invention to provide a method and apparatus for fault testing the clock distribution network of a data processor.

It is another object of the invention to provide a method and apparatus for isolating a fault in a clock distribution network to a particular clock signal line on a particular integrated circuit chip in the clock distribution network.

It is yet another object of the invention to provide a method and apparatus for fault testing a clock distribution network without requiring excessive fault testing circuitry.

It is still another object of the invention to provide a method and apparatus for fault testing a clock distribution network which is compatible with known LSSD techniques so that the block distribution network testing system can be integrated with the logic network fault testing system.

These and other objects are provided by an apparatus for fault testing the clock distribution network which fans out a clock signal from a system oscillator to a plurality of clock signal lines. The fault testing system includes a test latch which stores a logic value (binary ONE or ZERO) therein and a decoder for connecting any one of the clock signal lines to the test latch. Also provided is means for storing a first logic value in the test latch and placing a second logic value at the input thereof. Means are provided for enabling the clock distribution network to thereby propagate the second logic value through the test latch if the clock signal line under test is operating properly (i.e., it is not stuck-off), and for inhibiting the clock distribution network so that the second logic value will not propagate through the test latch if the clock signal line under test is operating properly (i.e., it is not stuck-on).

Accordingly, in order to fault test the clock distribution network, a first clock signal line is gated to the test latch and the clock distribution network is inhibited. The test latch is set to first logic value while a second logic value is placed at the input thereof. Accordingly, with the clock distribution network inhibited, the second logic value will not propagate through the test latch if the first clock signal line is operating properly. However, if the first clock signal line is stuck-on then the second logic value will propagate through the test latch. Thus, it may be ascertained whether the first clock signal line is stuck-on. The test latch is then set to a first logic value and a second logic value is placed at the input thereof. The clock distribution network is enabled for at least one clock cycle. If the first clock signal line is operating properly, the second logic value will propagate through the test latch. However, if the first clock signal line is stuck-off, then the second logic value will not propagate through the test latch. Thus, it may be ascertained whether the first clock signal line is stuck-off.

After testing the first clock signal line, the second and all the remaining clock signal lines are tested in the manner described above.

According to the present invention, one or more decoders are provided for selecting the clock signal line under test and connecting it to the test latch. One decoder may be provided on each integrated circuit chip in the clock distribution network, for selecting any one of the clock signal lines on the chip, and connecting the selected clock signal line to a clock test line. The clock test line from each chip is connected to a fault testing chip. The fault testing chip includes the test latch of the present invention and the data-in and data-out control signal lines therefor. Alternatively, a separate test latch may be provided on each individual clock distribution chip, so that a separate fault testing chip need not be provided. In one embodiment, the clock distribution network testing circuits of the present invention are designed in conformance with LSSD rules so that the clock distribution network testing circuits may be operated as part of the overall test circuitry for the data processor.

BRIEF DESCRIPTION OF THE DRAWINGS

FIG. 6 illustrates a method for controlling fault testing of clock signal lines according to the present invention; and.

BEST MODE FOR CARRYING OUT THE INVENTION

Figure 1:
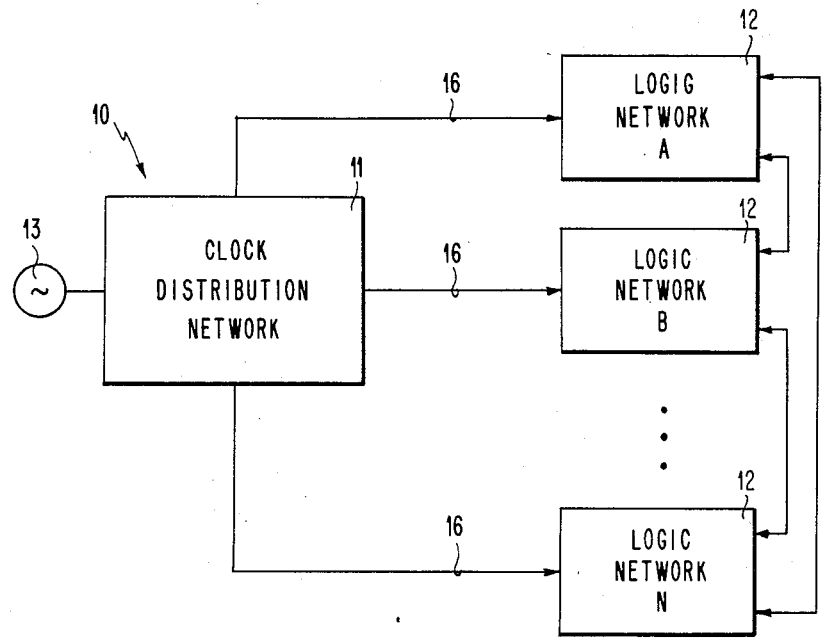
FIG. 1 illustrates a simplified representation of a data processor.

Referring now to FIG. 1 there is illustrated a simplified representation of a data processor. Data processor 10 includes a plurality of logic networks 12 each of which may include many thousands of logic gates for performing a specific data processing function. The logic network may also contain latches and chip arrays. A large data processor may include hundreds of such logic networks. Clock distribution network 11 is connected to a sinusoidal or other oscillator 13. Clock distribution network 11 distributes clock timing pulses derived from the oscillator signal to each of the logic networks throughout the data processor via clock distribution lines 16.

Figure 2:
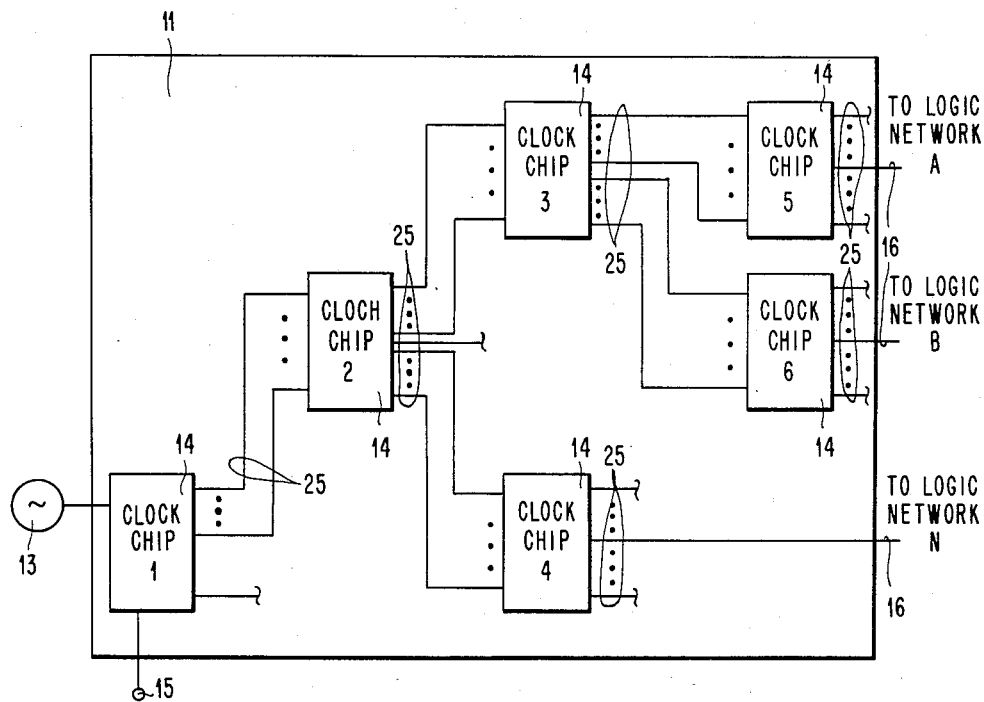
FIG. 2 illustrates a typical clock distribution network in a data processor, including a plurality of clock distribution chips.

FIG. 2 illustrates a more detailed representation of clock distribution network 11. Clock distribution network 11 is a fan-out network from the oscillator 13 to the plurality of clock distribution lines 16. Clock distribution network 11 is contained on a plurality of clock distribution chips 14. Typically, each clock distribution chip may have on the order of ten inputs which are fanned out to on the order of fifty outputs. Each clock chip output will hereinafter be referred to as a clock signal line, 25. Some of the clock signal line 25 are internal to clock distribution network 11 (e.g., the clock signal lines 25 which connect clock chip 2 and clock chip 3). On the other hand, some of the clock signal lines 25 form the clock distribution lines 16 which connect clock distribution network 11 to logic networks 12 (e.g., the clock signal line 25 which connects clock chip 5 to logic network A). In order to fault test clock distribution network 11, and to isolate a fault to a particular clock signal line 25, each clock signal line must be tested for stuck-on or off.

Figure 3:
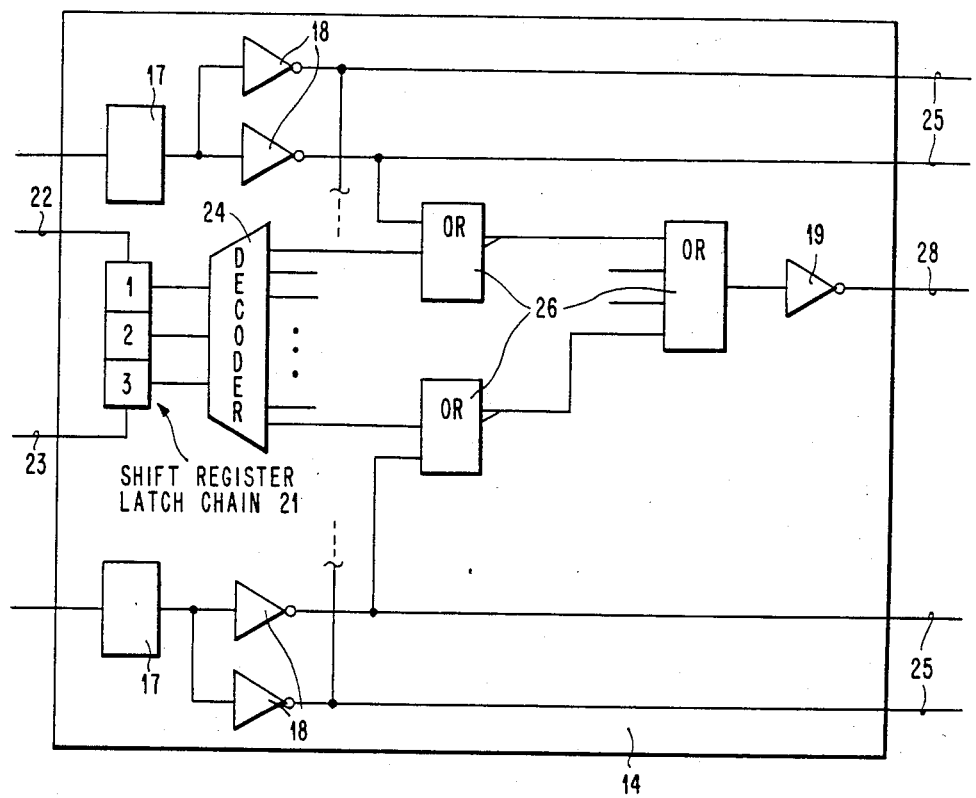
FIG. 3 illustrates a clock distribution chip including fault testing circuitry according to the present invention.

Referring now to FIG. 3, the details of a clock distribution chip 14 and the manner in which each clock signal line 25 is tested according to the present invention will be described. Clock distribution chip 14 includes a plurality of receivers 17 to which the clock chip inputs are applied, and a plurality of drivers 18 each of which drives a clock signal line 25. As illustrated in FIG. 3, one receiver 17 fans out to two drivers 18. However,m it will be recognized by those having skill in the art that different fan-out arrangements may be employed. It will also be recognized by those having skill in the art, that fault testing can be performed at the output of receivers 17 rather than at the output of drivers 18 as illustrated in FIG. 3. Fault testing at the output of receivers 17 reduces the number of lines to be tested, but also reduces the ability to isolate a fault to a particular clock distribution chip 14 or clock signal line 25.

In accordance with the present invention, each clock distribution chip 14 includes a decoder for selecting any one of the clock signal lines 25 on the clock distribution chip 14. The selected clock signal line is fault tested as described below. FIG. 3 illustrates a 3:8 decoder 24 for selecting any one of eight clock signal lines 25 and fanning the selected clock signal line to a clock test point 28 by means of a plurality of OR gates 26. As shown in FIG. 3, a shift register latch chain 21 may be employed for providing the address of the particular clock signal line 25 to be selected by decoder 24.

It will be understood by those having skill in the art that each clock distribution chip 14 may have its shift register latch inputs 22 connected to the shift register latch outputs 23 of another clock distribution chip 14 so that one long shift register is formed for the entire clock distribution network 11. Thus, any one clock signal line 25 in the entire clock distribution network 11 may be selected by shifting the proper address into shift register latch chain 21.

The selected clock signal line 25 is gated to a clock test driver 19 via a network of OR gates 26. It will be understood by those having skill in the art that other gating networks may be employed. Clock test line driver 19 drives clock test line 28 with the clock signal from the selected clock signal line 25. It will be recognized by those having skill in the art that other decoders other than 3:8 decoders may be employed, and that means other than a shift register and decoder may be employed for selecting a particular clock signal line. Regardless of the particular circuitry employed, the present invention provides means for selecting a single one of the clock signal lines 25 in clock distribution network 11.

Figure 4:
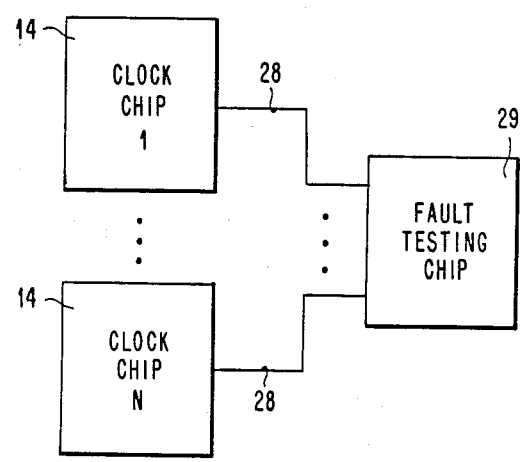
FIG. 4 illustrates connection of the clock distribution chips in a clock distribution network to a fault testing chip according to the present invention.

Referring now to FIG. 4, the clock test line 28 for each clock chip 14 is connected to fault testing chip 29. It will be recognized by those having skill in the art that the fault testing circuitry on chip 29 may also be replicated on each clock distribution chip 14 so that a separate fault testing chip 29 is not required.

Figure 5:
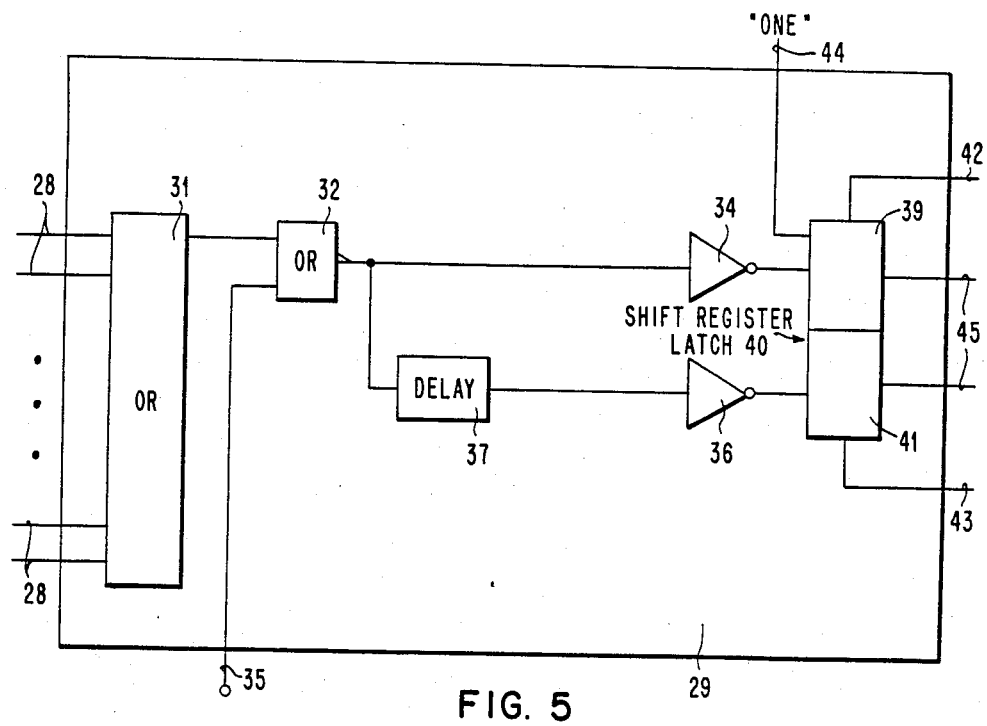
FIG. 5 illustrates a first embodiment of a fault testing chip according to the present invention.

Referring now to FIG. 5, a general schematic of fault testing chip 29 will be described. Chip 29 includes an OR gate 31 which receives all of the clock test lines 28 from all of the clock chips 14. In accordance with the above description, only one clock test line 28 will be active at a given time. The output of OR gate 31 and a block clock input line 33 is connected to an OR gate 32. Block clock input line 35 is used to prevent the setting of latch 40 while the address of the clock signal line to be tested is being shifted into shift register 21 (FIG. 3) as will be described below.

As shown in FIG. 5, the latch 40 for testing the clock signal lines is a master/slave latch including a master latch 39 and slave latch 41. However, it will be recognized by those having skill in the art that simple latches (e.g., a D type flip-flop) may be employed. The master/slave latch 40 has the advantage that it can be integrated into a shift register with other master/slave latches in the data processor. Master latch 39 includes a shift input 42 (which may be connected to a shift register latch string in the data processor) for providing the binary value to be shifted into the master latch. Slave latch 41 includes a latch output 43 for providing the binary value which has shifted through the latch. Also included is a data input 44 for injecting a binary value into the latch, and clock inputs 45 for controlling the shifting of binary values into and out of latch 40.

During fault testing, clocking for the latch is provided by the clock signal line under test, as routed into the output of OR gate 32. The output of the OR gate 32, which corresponds to the clock signal on the clock signal line under test, drives two latch drivers 34 and 36 for the master and slave latch 39 and 41, respectively. A dealy element 37 is also provided for the slave latch to ensure that slave latch 41 does not change state until after master latch 39 has latched data therein.

The fault testing circuitry on fault testing chip 29 (or as replicated on the individual clock chips 14) tests a clock signal line as follows: In order to test for a stuck-on clock (clock always running) a first logic value (e.g. binary ZERO) is shifted into latch 40 via shift input 42 (controlled by clock inputs 45) while the clock network 11 is inhibited. The clock network may be inhibited by means of an inhibit input 15 (FIG. 2) in the first clock chip, i.e., clock chip 1 which directly connects to oscillator 13). A second logic value (e.g., binary ONE) is maintained at the data input 44 of master latch 39. With the clock network inhibited, the second logic value at data input 44 value should not shift into the latch 44. However, if the clock signal line under test is stuck-on, the data will shift through the latch so that the output 43 of latch 40 will be at the second logic value (i.e., binary ONE). Thus, if the logic value at the data input 44 propagates through the latch 40 even though the clock network is inhibited, it may be ascertained that the clock signal line under test is stuck-on. It will be understood that the logic values described above may be reversed to perform the same function.

The clock signal line under test is tested for stuck-off (clock never runs) in a similar manner. A first logic value (e.g., binary ZERO) is stored in latch 40 while a second logic value (e.g., binary ONE) is maintained at data input 44. Clock distribution network 11 is enabled, e.g., by a signal at line 15 (FIG. 2). If the second logic value at data input 44 propagates through latch 40 and appears at output 43, then the clock signal line under test is not stuck-off. However, if the second logic value does not propagate through the latch when the clock distribution network is enabled, then the clock signal line under test is stuck-off. It will be recognized by those having skill in the art that the most efficient way of testing for stuck-off is to enable clock distribution network 11 for a single clock cycle. However, the network may be enabled for more than one clock cycle with the same results.

The shift register inputs and outputs 42, 43 (FIG. 5), the block clock input 35 (FIG. 5), the clock distribution network inhibit line 15 (FIG. 2) and the decoder shift register 21 (FIG. 3) may be controlled by a controller which is part of a maintenance processor incorporated into the data processing system. It will also be understood by those having skill in the art that the above enumerated control lines may be controlled and synchronized, and the resultant fault testing data analyzed by means of a special purpose hardware controller, a programmed dedicated controller, or a program which is part of a general purpose maintenance processor, according to the steps illustrated in FIG. 6.

Figure 6:
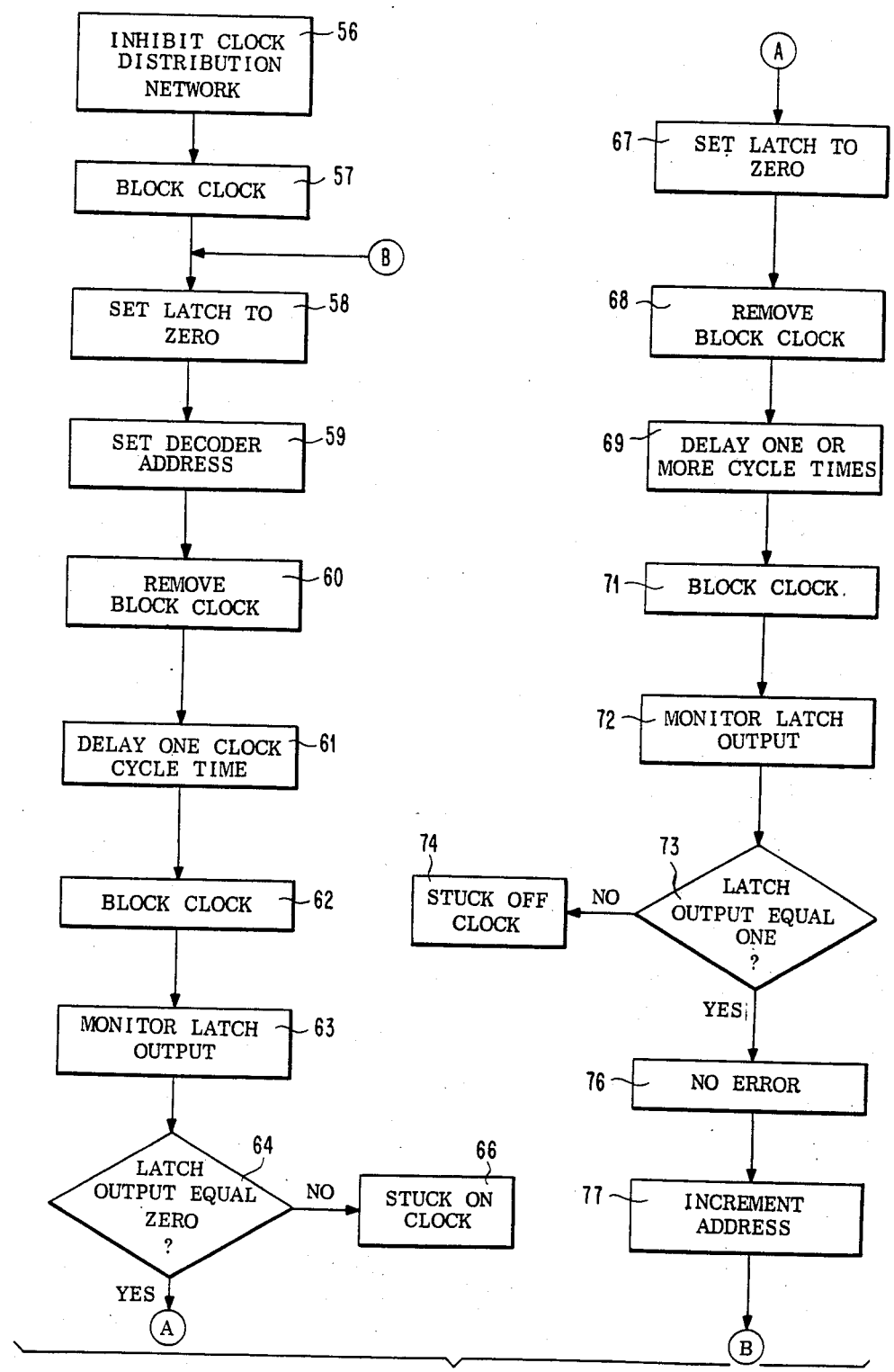

Referring now to FIG. 6, clock distribution network 11 (FIG. 1) is tested as follows: First, clock distribution network 11 is inhibited, e.g., by applying (block 56) an inhibit signal to line 15 (FIG. 2). Application of the clock distribution network inhibit signal effectively disconnects the oscillator from the clock distribution network. Then, the block clock signal 35 (FIG. 5) is applied (block 57) so that latch 40 (FIG. 5) is not set during the address setup procedure for the clock signal line under test. Then, (block 58) the first logical value (e.g., logic ZERO) is applied to master/slave latch 40 via its scan input 42 under the control of clock inputs 45. A second logic value (e.g., binary ONE) is always maintained at data input 44 as shown in FIG. 5. Next, (block 59) shift register 21 (FIG. 3) is loaded in order to select a clock signal line under test via decoder 24 (FIG. 3). While decoder 24 selects a clock signal line, the block clock signal 35 ensures that the latch value is not changed.

With the clock signal line under test selected by decoder 24, the block clock signal 28 is removed (block 60) and the test waits at least one clock cycle time (block 61) before again applying the block clock signal (block 62). The output 43 of latch 40 is then monitored (block 63). If (block 64) the output is binary ZERO, then the clock signal line under test operated properly because a binary ONE did not propagate through the latch when the clock was off. On the other hand, if the latch output is ONE, then the clock was stuck-on (block 66) in that binary ONE propagated through the latch notwithstanding the fact that the clock distribution network was inhibited.

Assuming the clock is not stuck-on, a stuck-off test is performed. The latch is again set to logic ZERO (block 67) and the block clock signal is removed (block 68). The test then waits for a time sufficient to allow at least one clock cycle to pass (block 68). The clock is then blocked again (block 71) and the output 43 of latch 38 is monitored (block 72). If the output is ONE (block 73), then there was no error (block 76) because the ONE did propagate through the latch. On the other hand, if the latch still remains at logic ZERO, then the clock is stuck-off (block 74) and there is an error. Assuming there was no error, then the shift register 21 may be incremented (block 77) and the next clock distribution line 25 may be fault tested. It will be understood by those having skill in the art that the order of performing stuck-on and stuck-off tests is immaterial.

The process continues until all of clock signal lines 25 are checked. Testing may stop when a fault is detected (block 66 or 74) and the shift register values may be read to ascertain which clock signal line 25 is faulty. Thus, it is possible to isolate the fault to a particular clock signal line and to determine whether the faulty line is stuck-on or stuck-off.

Figure 7:
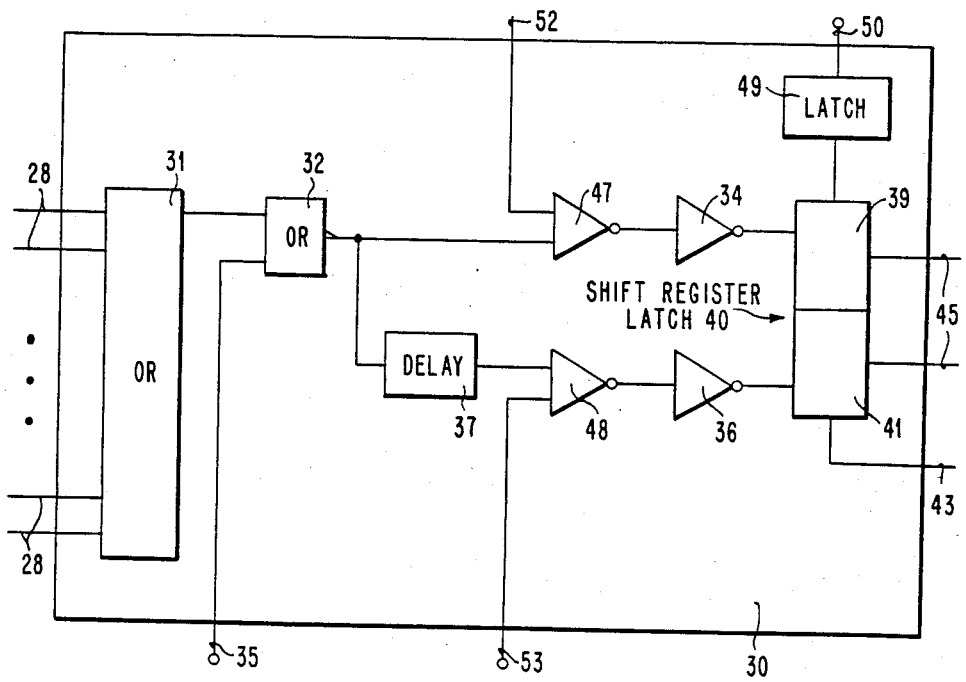
FIG. 7 illustrates an LSSD compatible fault testing chip according to the present invention.

FIG. 7 illustrates an LSSD compatible embodiment of the fault testing chip of the present invention. LSSD compatible fault testing chip 30 includes many of the same components as the embodiment of FIG. 5, with like components being indicated by like reference numbers. Other components have been added or modified to make the chip LSSD compatible. Specifically, separate clock controls 52, 53 for master latch and slave latch are provided. Thus, clock control 52 and its associated OR gate/driver 47 control clock driver 34, while clock control 53 and its associated OR gate/driver 48 control clock driver 36. For LSSD compatibility at the chip tester, the master and slave clocks for latches 39 and 41, respectively, must be controlled independently, as explained in detail in the above cited U.S. Pat. No. 3,783,254 to Eichelberger. For purposes of the present invention, clock controls 52 and 53 remain inactive during clock network fault testing. Additionally, both the data input 44 and the shift input 42 (FIG. 5) for latch 42 may be supplied from input line 50 via another latch 49 in the scan chain. The above described additions/modifications, ensure an LSSD compatible fault testing chip 30. The method of fault testing the clock distribution network is the same as described above with regard to FIG. 6.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. A method of fault testing a clock distribution network which fans out a clock signal to a plurality of clock signal lines, by performing the following steps on a clock signal line:
   connecting the clock signal line under test to a test latch;
   inhibiting said clock distribution network;
   setting said test latch to a first logic value, while maintaining a second logic value at the input thereof;
   monitoring the output of said test latch, to ascertain whether said second logic value propagates through said test latch notwithstanding the inhibition of said clock distribution network;
   enabling said clock distribution network; and
   monitoring the output of said test latch, to ascertain whether said second logic value fails to propagate through said test latch, notwithstanding the enabling of said clock distribution network.

2. A method of fault testing a clock distribution network which fans out a clock signal to a plurality of clock signal lines, by performing the following steps on a clock signal line:
   connecting the clock signal line under test to a test latch which is set to a first logical value and has a second logic value at the input thereof;
   monitoring the output of said test latch when said clock distribution network is inhibited to ascertain whether said second logic value propagates through said test latch notwithstanding the inhibition of said clock distribution network; and,
   monitoring the output of said test latch when said clock distribution network is enabled, to ascertain whether said second logic value fails to propagate through said test latch, notwithstanding the enabling of said clock distribution network.

3. A method of fault testing a clock distribution network which fans out a clock signal to a plurality of clock signal lines, by performing the following steps on a clock signal line:
   connecting the clock signal line under test to a test latch which is set to a first logical value and has a second logic value at the input thereof; and,
   monitoring the output of said test latch to ascertain whether said second logic value propagates therethrough when said clock distribution network is inhibited, and whether said second logic value fails to propagate therethrough when said clock distribution network is enabled.

4. The method of claims 1, 2, or 3, wherein the entire clock distribution network is fault tested by successively repeating the recited steps for each clock signal line in said clock distribution network.

5. Apparatus for fault testing a clock distribution network which fans out a clock signal to a plurality of clock signal lines, comprising:
   a test latch for storing a logic value therein;
   means for storing a first logic value in said test latch and placing a second logic value at the input thereof; and
   means for connecting a predetermined one of said clock signal lines to said test latch;
   whereby said second logic value is stored in said test latch when said clock distribution network is enabled and said predetermined one of said clock signal lines is operating properly, and said second logic values is not stored in said test latch when said clock distribution network is inhibited and said predetermined one of said clock signal lines is operating properly.

6. The apparatus of claim 5 further comprising means for enabling said clock distribution network to thereby store said second logic value in said test latch, and for inhibiting said clock distribution network to thereby prevent said second logic value from being stored in said test latch.

7. The apparatus of claim 5 wherein said test latch is a master/slave flip-flop.

8. The apparatus of claim 5 wherein said test latch is a shift register latch.

9. The apparatus of claim 5 wherein said connecting means is a decoder, one output of which may be selected to thereby gate said predetermined one of said clock signal lines to said test latch.

10. The apparatus of claim 9 further including a shift register connected to said decoder for providing the identity of the decoder output to be selected.

11. The apparatus of claim 5 wherein said clock distribution network is formed on a plurality of integrated circuit clock distribution chips and a single integrated circuit fault testing chip, with each of said integrated circuit clock distribution chips including a connecting means and wherein said test latch is included on said fault detection chip.

12. The appratus of claim 11 wherein said integrated circuit fault testing chip further comprises a gate for connecting each of said integrated circuit clock distribution chips to said test latch.

13. The apparatus of claim 5 wherein said clock distribution network is formed on a plurality of integrated circuit clock distribution chips, with each of said chips including a connecting means and a test latch.

14. The apparatus of claim 5 further comprising means for monitoring the output of said test latch to ascertain whether said second logic value is stored in said test latch when said clock distribution network is enabled and to ascertain whether said second logical value is not stored in said test latch when said lock distribution network is inhibited.

15. A data processor comprising:

at least one logic network for performing data processing operations;

a clock distribution network for fanning out a clock signal to a plurality of clock signal lines which provide timing signals for said at least one logic network; and means for verifying the proper operation of said clock distribution network and isolating a faulty operation to a particular clock signal line.

* * * * *

UNITED STATES PATENT AND TRADEMARK OFFICE
CERTIFICATE OF CORRECTION

PATENT NO. : 4,542,509

DATED : September 17, 1985

INVENTOR(S) : GREGORY S. BUCHANAN ET AL

It is certified that error appears in the above-identified patent and that said Letters Patent is hereby corrected as shown below:

| | |
|---|---|
| Column 1, line 14 | "on" should read "out". |
| Column 1, line 32 | "ae" should read "are'. |
| Column 5, line 1 | "33" should read "35". |
| Column 5, line 3 | "latch 40" should read "shift register latch 40". |
| Column 6, line 3 | "inputs" and "outputs" should read "input" and "output". |
| Column 6, line 36 | "28" should read "40". |
| Column 6, line 53 | "38" should read "40'. |
| Column 7, line 22 | "42" should read "40". |

Signed and Sealed this

Tenth Day of December 1985

[SEAL]

Attest:

DONALD J. QUIGG

Attesting Officer

Commissioner of Patents and Trademarks